US012537494B2

(12) United States Patent
Rogledi et al.

(10) Patent No.: US 12,537,494 B2
(45) Date of Patent: Jan. 27, 2026

(54) CIRCUIT ARRANGEMENT OF AN AMPLIFIER WITH CURRENT CONTROLLED GAIN AND CORRESPONDING METHOD

(71) Applicant: STMicroelectronics S.r.l., Agrate Brianza (IT)

(72) Inventors: Nicola Rogledi, Pavia (IT); Vanni Poletto, Milan (IT); Antonio Davide Leone, Siziano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 408 days.

(21) Appl. No.: 18/180,595

(22) Filed: Mar. 8, 2023

(65) Prior Publication Data

US 2023/0308066 A1    Sep. 28, 2023

(30) Foreign Application Priority Data

Mar. 22, 2022  (IT) .................... 102022000005651

(51) Int. Cl.
*H03F 3/45* (2006.01)
*H03F 3/04* (2006.01)
(Continued)

(52) U.S. Cl.
CPC .............. *H03G 3/30* (2013.01); *H03F 3/04* (2013.01); *H03G 1/0023* (2013.01); *H03G 2201/103* (2013.01)

(58) Field of Classification Search
CPC .. H03G 3/30; H03G 2201/103; H03G 1/0029; H03G 1/0023; H03G 1/0088;
(Continued)

(56) References Cited

U.S. PATENT DOCUMENTS 5,432,475 A * 7/1995 Fukahori ............. H03F 3/45479
330/261
5,471,173 A * 11/1995 Moore .................... H03F 3/347
327/350

(Continued)

FOREIGN PATENT DOCUMENTS

EP    0633657 A2    1/1995

OTHER PUBLICATIONS

Analog Devices, "Low Power, 18 MHz Variable Gain Amplifier, Data Sheet AD8338," Rev. C, https://www.analog.com/media/en/technical-documentation/data-sheets/AD8338.pdf, Apr. 2022, 20 pages.

(Continued)

*Primary Examiner* — Khanh V Nguyen
(74) *Attorney, Agent, or Firm* — Slater Matsil LLP

(57) ABSTRACT

In accordance with an embodiment, a variable gain amplifier includes: a first differential transistor pair coupled to a signal input; a first current source configured to provide a first bias current to the first differential transistor pair; a pair of diodes coupled to an output of the first differential transistor pair; a second differential transistor pair having an input coupled to the pair of diodes; a second current source configured to provide a second bias current to the second differential transistor pair; and a current control circuit coupled to the first current source and the second current source.

20 Claims, 12 Drawing Sheets

(51) Int. Cl.
*H03G 3/30* (2006.01)
*H03G 1/00* (2006.01)

(58) Field of Classification Search
CPC .................. H03G 3/45098; H03F 3/04; H03F 2203/45356; H03F 2203/45456; H03F 2203/45471; H03F 2203/45486; H03F 2203/45652; H03F 2203/45658; H03F 3/45183; H03F 2203/45392; G01S 7/529; G01S 15/10; G01S 15/931
See application file for complete search history.

(56) References Cited

U.S. PATENT DOCUMENTS

| | | | |
|---|---|---|---|
| 6,020,786 A * | 2/2000 | Ashby | H03G 1/04 327/359 |
| 6,369,618 B1 * | 4/2002 | Bloodworth | G05F 1/562 327/346 |
| 2013/0049869 A1 | 2/2013 | Collins, III et al. | |

OTHER PUBLICATIONS

Wang, Haipeng et al., "Ultrasonic Detection Device Design Based on Substation Intelligent Inspection Robot", IEEE 4th International Conference on Applied Robotics for the Power Industry (CARPI), Oct. 11-13, 2016, 4 pages.

\* cited by examiner

CIRCUIT ARRANGEMENT OF AN AMPLIFIER WITH CURRENT CONTROLLED GAIN AND CORRESPONDING METHOD

CROSS-REFERENCE TO RELATED APPLICATIONS

This application claims the benefit of Italian Patent Application No. 102022000005651, filed on Mar. 22, 2022, which application is hereby incorporated herein by reference.

TECHNICAL FIELD

The embodiments of the present disclosure relate to amplification techniques with current-controlled gain.

BACKGROUND

Variable-gain amplifiers are known, which vary their own gain on the basis of a control quantity. Such variable-gain amplifiers are widely used in many fields of electronics, amongst which telecommunications, processing of audio signals, and detection via sensors, for example, ultrasonic obstacle detectors.

A known and simple way for implementing a variable gain is to use variable components on the feedback branch of a voltage amplifier, which, as is known, comprises a variable resistance on the input terminal, for example an inverting terminal, and a variable feedback resistance between the output and the input. The gain depends upon the ratio of two resistances and hence upon their value: by varying either one or both, the gain varies. It is very difficult, however, to obtain a ratio of resistances independent of the value of such resistances. Passing from very low gains to very high gains is difficult. The selection components typically used (for example, MOSFETs) for imposing the value of gain may have on-state resistances, Ron, comparable with those of the variable resistors, thus jeopardizing their precision.

Circuits are known that solve the problem of gain accuracy, generating a current starting from another current via cells with two differential pairs of transistors, one for the input and one for the output, cross-coupled, i.e., the transistors of one and the same branch in each differential pair have their base in common. The outputs are, for example, connected to the inputs of an amplifier, the outputs of which are connected to the common base electrodes. An example of the aforesaid variable-gain amplifier circuit may be found, for example, in the URL https://www.analog.com/media/en/technical-documentation/data-sheets/AD8338.pdf, page 12 (FIG. 40). This type of circuit makes it possible to obtain a high gain precision. In this case, there is a biasing current (both at input and at output) depending upon the gain selected. Similar solutions hence render the performance of the circuit in terms of biasing dependent upon the gain. Moreover, there is a gain error that depends upon the mismatches of the beta factors β of the bipolar transistors of the differential pairs.

SUMMARY

The present disclosure provides embodiments that include a circuit arrangement of an amplifier with current-controlled gain, the circuit arrangement having a symmetrical differential structure, comprising a differential input stage, which includes, on each differential branch, an input transistor, in particular a MOSFET, coupled, in particular through an input resistance, to an input node, there being set between the input node and ground a current generator for biasing the input stage that supplies the input stage being configured for operating with a constant input biasing, an input voltage being applied between the inputs of the input transistors, a drain electrode of the input transistor being coupled to the supply voltage through a respective diode, as well as to a differential output amplification stage having bipolar transistors with coupled emitters, there being coupled to the emitters a current generator for biasing the output stage which generates an output current and comprises, on each differential branch, a bipolar transistor biased in the active region, the base electrode of which is coupled to the drain electrode of the input transistor and the collector electrode of which is coupled to the supply voltage, while coupled to its emitter electrode is a current generator for biasing the output stage which generates an output current. An output voltage is drawn from between the collectors of the bipolar transistors, the output stage being configured with constant output biasing; the circuit arrangement is configured for controlling a gain between the input and the output by controlling the values of input and output biasing current; the circuit arrangement is configured for supplying a first reference current and a second reference current having complementary values such that their sum is constant; the value of the input biasing current corresponds to the first reference current, and the output biasing current corresponds to the sum of the first reference current and the second reference current.

In variant embodiments, the circuit arrangement is configured for controlling a gain between the input voltage and the output voltage, keeping the biasing current of the output stage at a constant fixed value and controlling the value of the biasing current of the input stage, the input-stage biasing-current generator being controlled, in particular, via a digital signal generated by a digital-to-analog converter.

In variant embodiments, the differential output amplification stage with emitter-coupled bipolar transistors, comprises, on each differential branch, a bipolar transistor biased in the active region, the base electrode of which is coupled to the drain electrode of the input transistor and the collector electrode of which is coupled to the supply voltage, while coupled to its emitter electrode is a current generator for biasing the output stage, which generates an output current.

In variant embodiments, each differential branch comprises an operational amplifier, the output of which is coupled to the control input, in particular the gate, of the input transistor, an output of which, in particular the source, is coupled to the inverting input of the respective operational amplifier, the input voltage being applied between the non-inverting inputs of the operational amplifiers.

In variant embodiments, the first reference current and the second reference current are supplied by a differential digital-to-analog converter.

In variant embodiments, the circuit arrangement comprises a further circuit for biasing the output stage comprising a control loop configured for controlling the output biasing-current generator in such a way as to regulate the collector current of the bipolar transistor so that it follows a reference value of collector current.

In variant embodiments, the circuit arrangement comprises a further circuit for biasing the diodes, comprising a control loop configured for controlling the input biasing-current generator in such a way as to regulate the current in the diodes so that it follows a reference value of diode current.

In variant embodiments, the bipolar transistors are comprised in a circuit arrangement configured for recovering and compensating the base current of the bipolar transistors.

In variant embodiments, the circuit arrangement configured for recovering and compensating the base current of the bipolar transistors comprises the output bipolar transistor and a supporting bipolar transistor associated to a control loop, which comprises a current mirror that receives at input the output current of the input bipolar transistor and supplies at output to the supporting bipolar transistor the current as base current, the base current being mirrored in the base of the output bipolar transistor.

The present disclosure also describes an ultrasonic obstacle detector including a receiver comprising a circuit arrangement of an amplifier with current-controlled gain according to embodiments.

The present disclosure also describes a method for controlling a circuit arrangement of an amplifier with current-controlled gain according to embodiments that includes controlling a gain between the input and the output by controlling the values of the input and output biasing current.

In variant embodiments, the method comprises controlling a gain between the input voltage and the output voltage, keeping the biasing current of the output stage at a constant fixed value and controlling the value of the biasing current of the input stage, the input-stage biasing-current generator being controlled, in particular, via a digital signal generated by a digital-to-analog converter.

In variant embodiments, the method comprises supplying a first reference current and a second reference current of complementary values such that their sum is constant, the value of the input biasing current corresponding to the first reference current, and the output biasing current corresponding to the sum of the first reference current and the second reference current, in particular the first reference current and the second reference current being supplied by a differential digital-to-analog converter.

BRIEF DESCRIPTION OF THE DRAWINGS

Embodiments of the present disclosure will now be described with reference to the annexed drawings, which are provided purely by way of non-limiting example, and in which.

DETAILED DESCRIPTION OF ILLUSTRATIVE EMBODIMENTS

In the ensuing description, numerous specific details are illustrated in order to enable an in-depth understanding of embodiments. The embodiments may be implemented without one or more of the specific details or with other methods, components, materials, etc. In other cases, well-known operations, materials or structures are not illustrated or described in detail so that certain aspects of the embodiments will not be obscured.

Reference to "an embodiment" or "one embodiment" in the framework of the present disclosure is intended to indicate that a particular configuration, structure, or characteristic described with reference to the embodiment is comprised in at least one embodiment. Hence, phrases such as "in an embodiment" or "in one embodiment" or the like that may be present in various points of the present description do not necessarily all refer to one and the same embodiment. Moreover, particular conformations, structures, or characteristics may be combined in any adequate way in one or more embodiments.

The references used herein are provided merely for convenience and hence do not define the sphere of protection or the scope of the embodiments.

Components, elements, or parts that will be described with reference to one drawing are designated, in the subsequent drawings, by the same references as those used in that drawing; the description of the aforesaid elements already described will not be subsequently repeated in order not to overburden the present detailed description.

Figure 1:
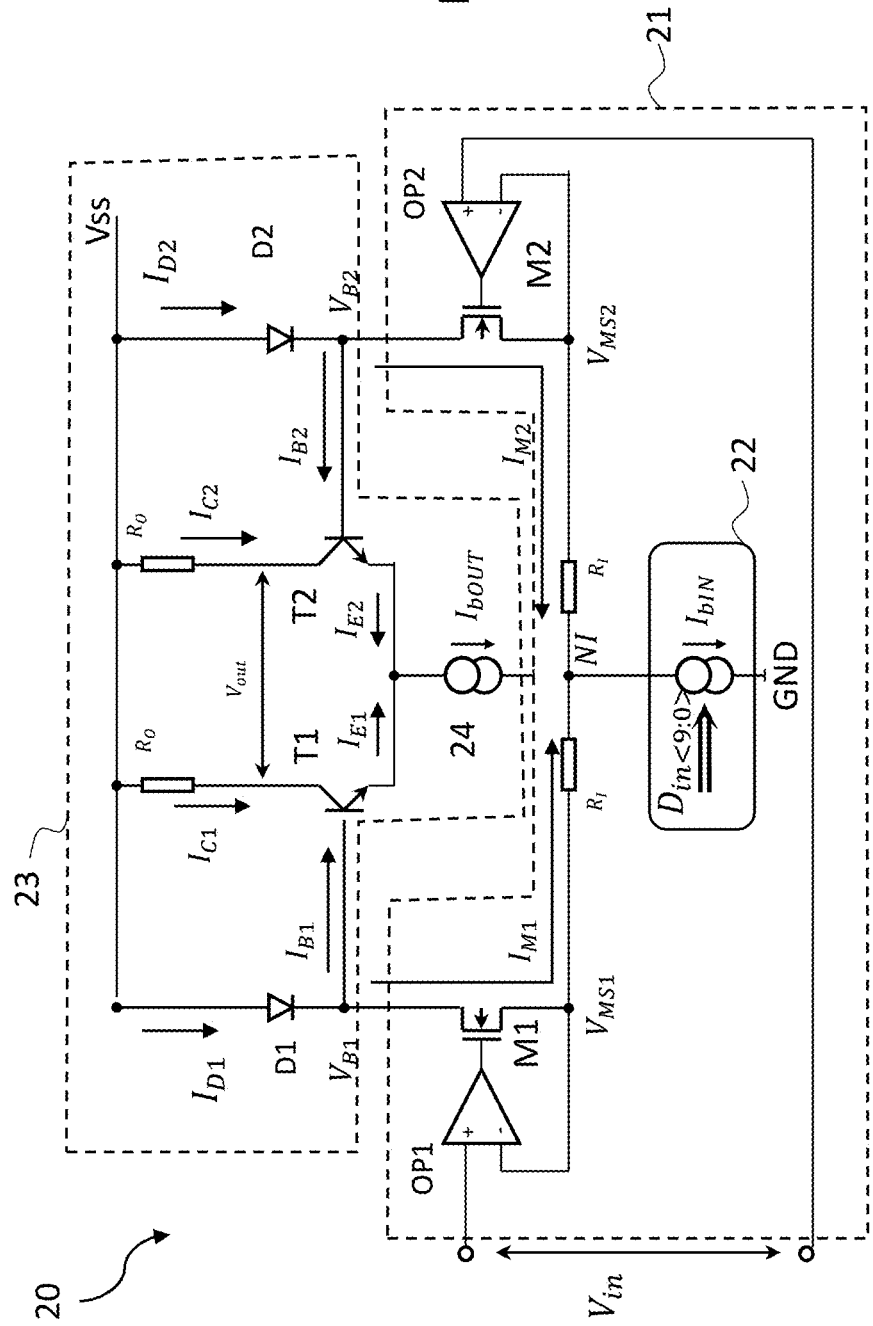
FIG. 1 is a schematic illustration of a circuit arrangement according to first embodiments.

Shown in FIG. 1 is a current-controlled gain amplifier 20, which has a structure of a substantially Gilbert-cell type.

The current-controlled gain amplifier 20 substantially has a symmetrical differential structure. It includes an input stage 21 comprising a first differential branch that includes an operational amplifier OP1, the output of which is coupled to the input electrode of a MOSFET M1, in which a current $I_{M1}$ flows between the drain electrode and the source electrode. The source electrode of the MOSFET M1 is coupled to the inverting input of the operational amplifier OP1 and, through an input resistance $R_I$, to an input node NI, there being set, between the input node and ground, a current generator 22 for biasing the input stage 21, which receives a value of input current $I_{bIN}$ that is controlled via a digital signal $D_{in}$, in particular a 10-bit signal, $D_{in<9:0>}$, generated by a digital-to-analog converter, not illustrated in FIG. 1, the input current $I_{bIN}$ having a direction exiting from the node NI towards ground GND. The drain electrode of the MOSFET M1 is coupled to the supply voltage Vss through a diode D1, the negative terminal of which is coupled to the drain of the MOSFET M1 and the positive terminal of which is coupled to the supply voltage Vss. The drain electrode of the MOSFET M1, formed on which is a base voltage $V_{B1}$, is also coupled to an output stage 23, comprising two bipolar transistors T1 and T2, specifically to the base electrode of a first bipolar transistor T1, the collector of which is coupled to the supply voltage through an output resistance $R_O$, whereas coupled to its emitter is a current generator 24 for biasing the output stage 23, which generates an output current $I_{bOUT}$, the direction of flow of which is from the emitter to ground. In the diode D1 is a current $I_{D1}$ flows from the supply voltage to the drain of the MOSFET M1, while in the output resistance $R_O$ is a collector current $I_{C1}$ flows towards ground GND, the emitter current $I_{E1}$ being indicated also as flowing towards ground.

Symmetrically, the current-controlled gain amplifier 20 comprises a second differential branch, which includes an amplifier OP2, the output of which is coupled to the input of a MOSFET M2, in which a current $I_{M2}$ flows between the drain and the source. The source electrode is coupled to the inverting input of the operational amplifier OP2 and, through an input resistance $R_I$, having a value equal to that of the other branch and hence designated by the same reference, to the input node NI, which is hence coupled to the sources of the MOSFETs M1 and M2 and to the input-current generator 22. The drain electrode of the MOSFET M2 is coupled to the supply voltage Vcc through a respective diode D2, similar to the diode D1 of the other branch and likewise positioned with its negative terminal, or cathode, towards the drain of the MOSFET M2 and its positive terminal, or anode, towards the supply voltage Vcc.

The drain electrode of the MOSFET M2, on which a base voltage $V_{B2}$ is set up, is also coupled to the base electrode of a second bipolar transistor T2, the collector of which is coupled to the supply voltage through a further output resistance $R_O$, while coupled to its emitter is the output-current generator 24 and the emitter of the first transistor T1. In the diode D2 a current $I_{D2}$ flows from the supply voltage to the drain of the MOSFET M2, while in the output resistance $R_O$ a collector current $I_{C2}$ flows towards ground, an emitter current $I_{E2}$ being instead indicated as flowing in the opposite direction, so that the output current $T_{bOUT}$, which flows towards ground GND, is equal to the sum of the currents $I_{E1}$ and $I_{E2}$. MOSFETs M1 and M2 may be referred to as a differential pair of transistors. MOSFETs M1 and M2 in combination with resistors $R_I$ may be referred to as a degenerated MOSFET differential pair.

An output voltage Vout is measured between the collectors of the bipolar transistors T1 and T2, towards the bases of which base currents $I_{B1}$ and $I_{B2}$ flow.

An input voltage Vin is applied between the non-inverting terminals of the operational amplifiers OP1 and OP2.

As regards biasing of the circuit 20 we have the following situation. Recalling that $I_C=I_E-I_B$, the biasing conditions are that the transistors T1 and T2 are biased in the active region. To a first approximation, the base currents $I_{B1}$ and $I_{B2}$ are negligible with respect to the collector currents. By symmetry, $$I_{E1}=I_{E2}=-I_{bOUT}/2$$

$$I_{C1}\cong -I_{E1}=I_{bOUT}/2$$

$$I_{C2}\cong -I_{E2}=I_{bOUT}/2$$

This but for the contribution of the current injected into the base of each transistor. Regarding transistors M1 and M2, by symmetry, $$I_{M1}=I_{M2}=I_{bIN}/2$$

As in the case of biasing of the bipolar transistors T1 and T2, it is assumed that the base current subtracted from the biasing current of the diodes D1 and D2 is negligible, and hence $$I_{D1}=I_{M1}-I_{B1}\cong I_{bIN}/2$$

$$I_{D2}=I_{M2}-I_{B2}\cong I_{bIN}/2.$$

Figure 2:
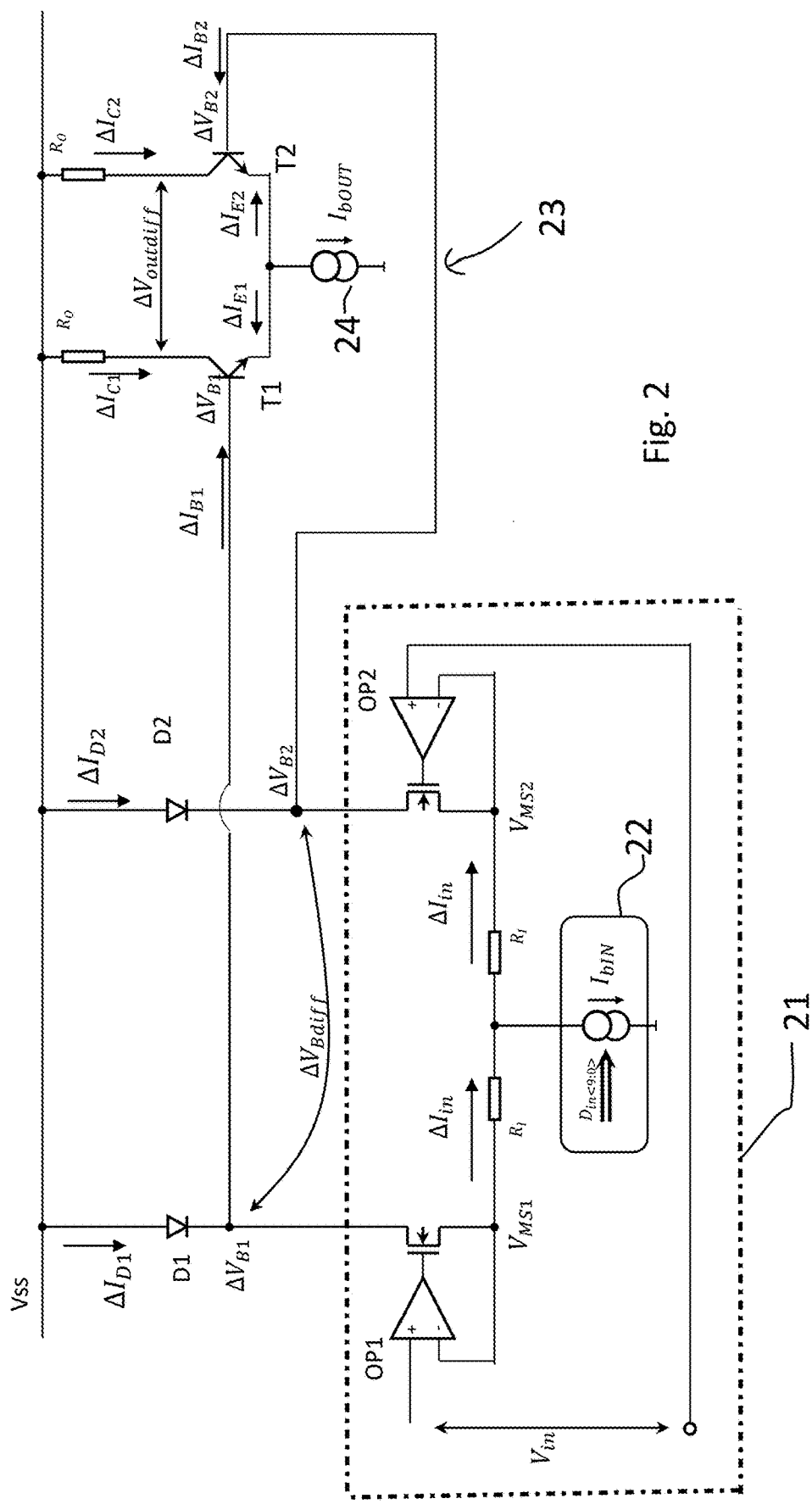
FIG. 2 is a schematic illustration of the circuit arrangement of FIG. 1 according to embodiments with further details of implementation.

FIG. 2 is a representation of the circuit of the current-controlled gain amplifier 20, corresponding as regards circuit arrangement to that of FIG. 1, where quantities for small-signal analysis are indicated, in which the input circuit 21 and the output circuit 23 are visible in a more distinct way.

Hence, the circuit of the current-controlled gain amplifier 20 comprises the output circuit 23, which basically comprises the pair of bipolar transistors T1, T2 and the output-current generator 23, which supplies the biasing current of the pair, i.e., the output current $I_{bOUT}$, the output circuit 23 representing a differential amplification stage with emitter-coupled bipolar transistors. For this structure, in small-signal regime, the relation between the variation $\Delta V_{Bdiff}$ of the input signal, which is the difference between the voltages on the bases of the two transistors, $V_{Bdiff}=V_{B1}-V_{B2}$, and the variation of the output signal, which is the difference between the voltages on the collectors, $V_{OUT}=V_{C1}-V_{C2}$, is the following:

$$\Delta V_{OUTdiff}=-g_{mT}R_O\Delta V_{Bdiff}$$

where $\Delta_{OUTdiff}$ and $\Delta V_{Bdiff}$ are the small-signal variations of the respective quantities $V_{OUTdiff}$ (output) and $V_{Bdiff}$ (input).

The parameter $g_{mT}=dI_C/dV_{BE}=I_C/V_T$ represents the transconductance of each of the two bipolar transistors T1 and T2 in the operating point determined by the biasing collector current $I_C$ and, given what has been said previously, is the same for both and is approximately equal to:

$$g_{mT}\cong \frac{I_{bOUT}}{2V_T}.$$

The input stage 21, comprising the components OP1, OP2, M1, M2, $R_I$, 22, uses a circuit to provide high impedance and render the biasing current of the input transistor M1, M2 independent of the input signal.

The function performed by the two operational amplifiers OP1 and OP2 is to bring the voltage level present on the non-inverting input directly back onto the respective source electrode of the two MOS transistors M1 and M2. As a result of this function, once again analysing the circuit in the small-signal regime, when a (small-signal) voltage $V_{IN}$ is imposed on the input of the circuit, this alters the static biasing condition and is transferred to the series of the two resistances $R_I$, thus bringing about a variation of input current $\Delta I_{IN}$ that flows in each of them, proportional to the input signal applied and obviously of opposite sign (and hence direction), in the two branches of the input stage 21:

$$\Delta I_{IN}=V_{IN}/(2R_I)$$

As regards calculation of the gain in small-signal regime, the diodes D1 and D2 are, for example, obtained via diode-connected transistors (base shorted to the collector).

As is known, the transconductance of the two diodes D1 and D2, $g_{mD1}$, $g_{mD2}$, is $$g_{mD1} = \frac{dI_D}{dV_D} = I_{D1}/V_T$$

$$g_{mD2} = \frac{dI_D}{dV_D} = I_{D2}/V_T.$$

In the case of the amplification circuit with current-controlled gain 20 described, the above two diodes D1 and D2 are the same as one another and biased in the same way so that the transconductances are identical to one another and (approximately) equal to $$g_{mD} = g_{mD1} = g_{mD2} = \frac{I_D}{V_T} \cong I_{bIN}/2V_T$$

where, in the analysis of biasing, it is assumed, as has been said, that the contribution of the base current absorbed by the respective bipolar transistors and subtracted from the biasing of the two diodes is negligible.

Proceeding with the analysis, as a result of the variation of the input current $\Delta I_{IN}$ in each of the two branches there is brought about a variation of the current $\Delta I_{D1} \cong \Delta I_{IN}$ and $\Delta I_{D2} \cong -\Delta I_{IN}$ that flows in the respective diodes D1 and D2 (but for the base currents absorbed by the transistors T1 and T2), which, in turn, as a result of the voltage-current characteristic of the diode, results in a variation of voltage on the bases of the respective transistors T1, T2, namely, $\Delta V_{B1} \cong -\Delta I_{IN}/g_{mD}$ and $\Delta V_{B2} \cong -\Delta I_{in}/g_{mD}$. Hence, we have $$\Delta V_{Bdiff} = -2\Delta I_{in}/g_{mD}$$

and consequently $$\Delta V_{Bdiff} = -V_{in}/(g_{mD}R_I).$$

Substituting the above in the equation $\Delta V_{OUTdiff} = -gm_T R_O \Delta V_{Bdiff}$, we obtain $$\Delta V_{OUTdiff} = g_{mT}R_0 V_{IN}/(g_{mD}R_I) = \frac{g_{mT}R_O}{g_{mD}R_I} V_{in} \cong \frac{I_{bOUT}R_O}{I_{bIN}R_I} V_{in},$$

As may be noted from the formula of the voltage gain $A_V$, the latter can be programmed on a scale of different values keeping fixed and constant the biasing current of the output stage 23 $I_{bOUT}$ and varying/controlling the biasing current of the input stage $I_{bIN}$ using a current generator controlled by a digital-to-analog converter (DAC).

$$A_V = \frac{\Delta V_{OUTdiff}}{V_{in}} = \frac{g_{mT}R_O}{g_{mD}R_I} \cong -\frac{I_{bOUT}}{I_{bIN}} \frac{R_O}{R_I} = \frac{I_{bOUT}}{I_{LSB}D_{in<9:0>}} \frac{R_O}{R_I}.$$

The current gain is instead $$A_I = \frac{\Delta V_{OUTdiff}}{2\Delta I_{IN}} = \frac{\Delta I_{OUTdiff}}{\Delta I_{INdiff}} = \frac{g_{mT}}{g_{mD}} \cong -\frac{I_{bOUT}}{I_{bIN}} = \frac{I_{bOUT}}{I_{LSB}D_{in<9:0>}}.$$

As has been said, this analysis has been made on the assumption of negligible base currents. But if also these were taken into account, it can be shown that a more accurate relation between the input-current variation $\Delta I_{IN}$ and the output-current variation $\Delta I_{OUT}$ (and hence the current gain) is $$\Delta I_{OUTdiff}\left(1 + \frac{1}{g_{mD}\beta}\right) = \frac{g_{mT}}{g_{mD}} \Delta I_{INdiff},$$

where: $g_{mT} = \frac{I_C}{V_T} = -\frac{I_E}{V_T}\frac{\beta}{1+\beta} = -\frac{I_{bOUT}}{2V_T}\frac{\beta}{1+\beta}$ $$g_{mD} = \frac{I_D}{V_T} = \frac{\left(\frac{I_{bIN}}{2} - I_B\right)}{V_T} = \frac{\left(\frac{I_{bIN}}{2} - \frac{I_{bOUT}}{2}\frac{1}{1+\beta}\right)}{V_T},$$

where, as is known, $\beta$ is the ratio between the collector current and the base current of the bipolar transistors T1, T2 and their threshold voltage $V_T$.

The amplification circuit with current-controlled gain 20 described with reference to FIGS. 1 and 2 provides a variable-gain amplifier with constant input and output biasing.

The above circuit in general presents a criticality as regards matching of the currents. The input current $I_{bIN}$ must range from one hundredth of the value to the value of the output current $I_{bOUT}$, so that the ratio between the currents $I_{bOUT}/I_{LSB}$ should be precise and kept constant in time, i.e., independent of the any disturbance during production and operation (temperature variation, process spread, etc.). Further criticalities, described in greater detail with reference to the embodiment of FIG. 11, may regard the beta factor.

Figure 3:
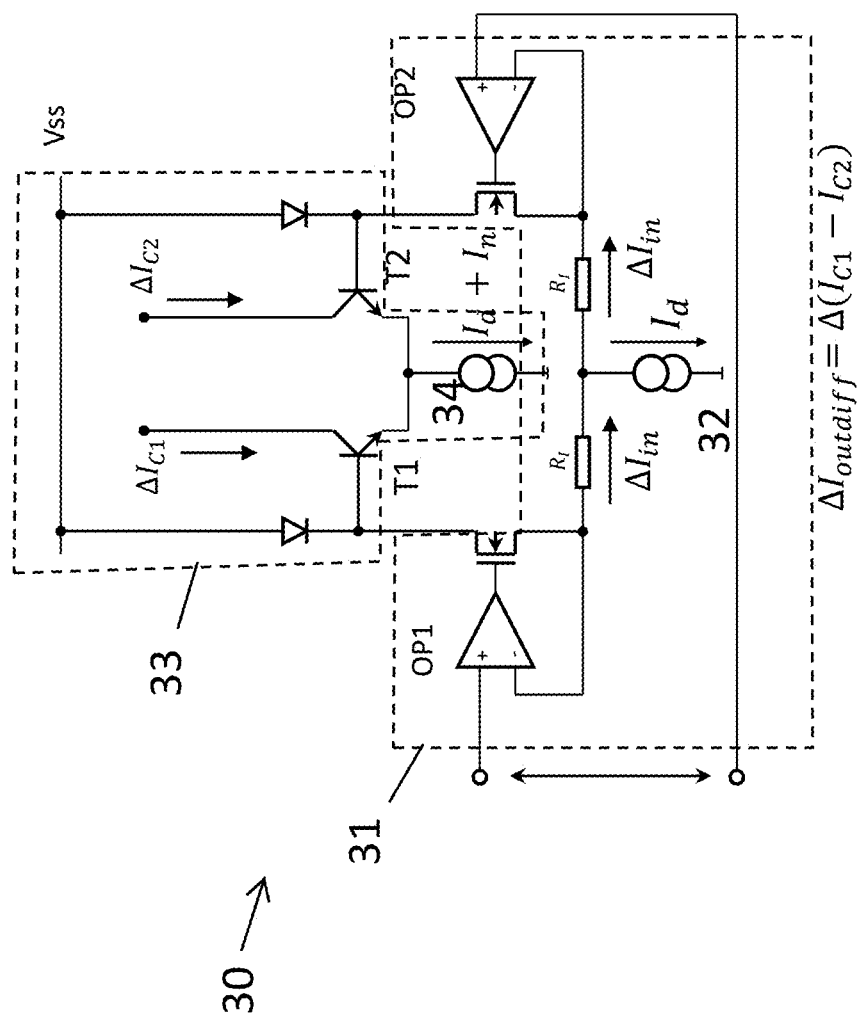
FIG. 3 is a schematic illustration of a circuit arrangement according to embodiments.

Hence, with reference to FIG. 3 an embodiment is described for implementing a function of amplifier used for equalizing the output signal as the input signal varies, via gain adjustment.

The embodiment described thus refers to a variable-gain amplifier with constant output biasing that divides the input and output biasing currents as a function of the gain to be obtained.

Constant-current output biasing presents the advantage of maintaining the stage downstream always in the same operating conditions, thus preventing, for example, problems of common-mode variation that might disturb the operating point.

In particular, as illustrated in FIG. 3, a biasing of the input stage is carried out with a denominator current of programmable value $I_d$. Biasing of the output stage is carried out with a constant current $I_{bOUT}$, the value of which is, however, obtained from the sum of two current contributions, one of which is a first reference current, or denominator current, of programmable value $I_d$, and the other is a second reference current, or numerator current $I_n$, i.e., of a value complementary with respect to the constant current $I_{bOUT}$, namely, such that $I_{bOUT} = I_d + I_n$.

FIG. 3 hence shows an embodiment 30 of an amplification circuit with current-controlled gain that corresponds for the most part to the amplification circuit 20. Instead of the generator 22, however, a programmable current generator 32 is provided, which generates the denominator current of programmable value $I_d$ under the control of a signal of a DAC (not illustrated in FIG. 3).

Instead of the current generator 24, a current generator 34 is provided, which generates a current of constant value obtained from the sum of two current contributions, one of which is the denominator current of programmable value $I_d$ and the other is the complementary numerator current $I_n$, such that $I_{bOUT} = I_d + I_n$, which is a constant current.

As has been said, the amplification circuit 30 represented is topologically similar to the amplification circuit 20 and is distinguished by the choice of the biasing currents of the input and output stages. It is hence possible to proceed with biasing and small-signal analyses similar to those developed previously for the amplification circuit 20.

As has been said, the input stage, designated by 31 in FIG. 3, uses a circuit to render the biasing current of the input transistor independent of the input signal.

In small-signal regime, if $\Delta I_{IN}$ is the variation of the current in the individual branch of the input stage 31 that flows in each resistance $R_f$ and is induced by the variation of the input signal $V_{IN}$ and if $\Delta I_{diffout} = \Delta(I_{C1} - I_{C2})$ is the variation of the differential output current $(I_{C1} - I_{C2})$ induced once again by the input signal $V_{IN}$, we can write the relation between these two variations of currents, thus determining the current gain.

The gain of the circuit 30 defined as $\Delta I_{diffout}$ over $2\Delta I_{IN}$ can be obtained from the following:

$$\Delta I_{OUTdiff} = 2\Delta I_{IN} \cdot \frac{g_{mT}}{g_{mD}},$$

and hence, to a first approximation, i.e., neglecting the contribution of the base currents, $$\Delta I_{OUTdiff} \cong 2\Delta I_{IN} \cdot \frac{I_d + I_n}{I_d}.$$

The expression of the current gain is thus $$A_I = \frac{\Delta I_{OUTdiff}}{2\Delta I_{IN}} = \frac{\Delta I_{OUTdiff}}{\Delta I_{INdiff}} \cong \frac{I_d + I_n}{I_d}$$

which, as expected, is a function of the denominator current $I_d$ and the numerator current $I_n$. Hence, the output biasing depends upon the sum current $I_d + I_n$.

The gain is a function of the denominator current $I_d$ and the numerator current $I_n$. If the sum of the currents, or sum current, $I_d + I_n$ is constant, the output stage 33 is biased always in the same way. This makes it possible to get the stage downstream of the circuit 30 to function at a constant biasing independent of the gain.

It is thus envisaged to use, in association with the amplification circuit 30, a differential DAC, the output currents of which are complementary and the sum of which is constant, i.e., the output currents correspond to the currents $I_d$ and $I_n$ used by the circuit 30.

The denominator current $I_d$ is mirrored by a branch of the differential DAC, and the sum current $I_d + I_n$ is the sum of the two branches. The currents $I_d$ and $I_d + I_n$ can be obtained from components that are the same as one another and have the same temperature dependence.

The gain of the Gilbert cell depends upon the collector currents of the bipolar transistors (the diodes may also be implemented using bipolar transistors). In the configuration of the circuit 30, these currents are not controlled because they are imposed by the emitter and the cathode of the diode. Hence, for applications that require gains that are very precise and high (high current ratio $(I_d + I_n)/I_d$, low currents $I_d$) the circuit 30 may present a limitation in precision.

Figure 4:
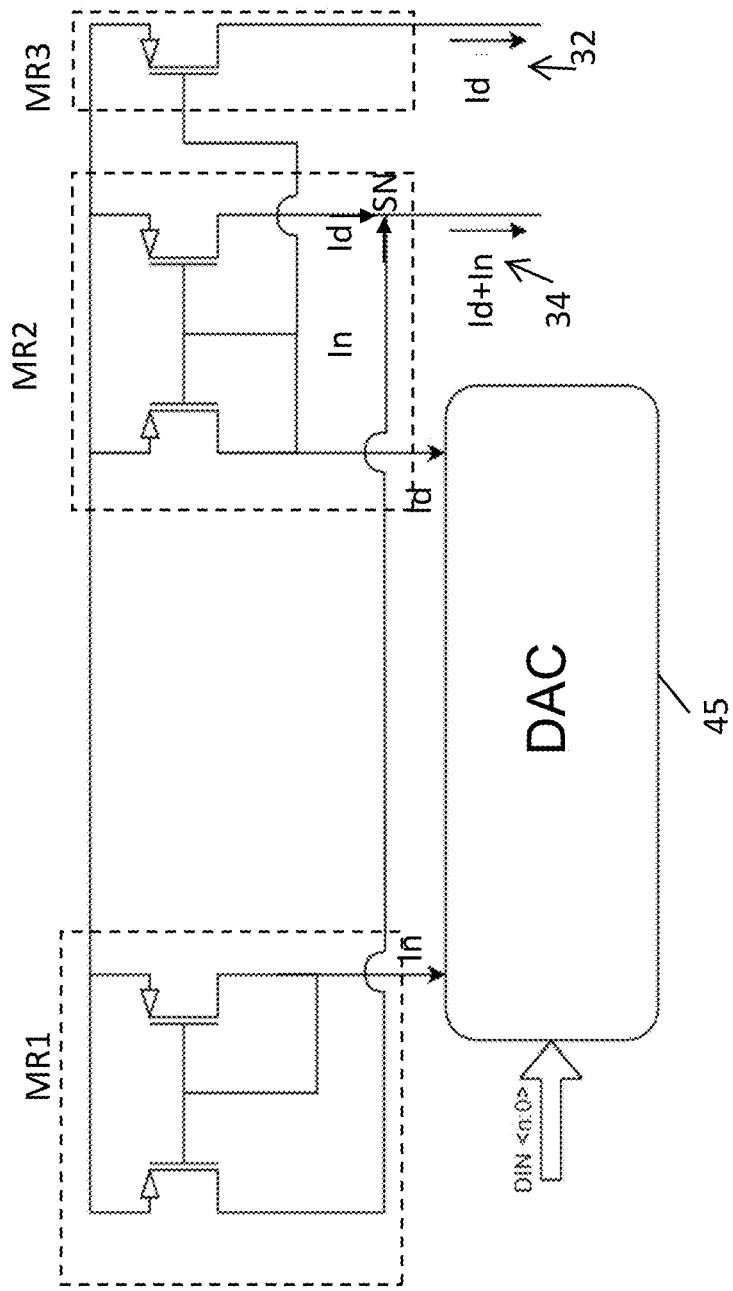
FIG. 4 is a schematic illustration of a circuit used by the circuit arrangement according to the foregoing embodiments.

To solve the aforesaid problem, illustrated in FIG. 4 is an embodiment 40, which corresponds to the embodiment 30 but in which a digital-to-analog converter (DAC) 45 is illustrated that supplies the denominator current $I_d$ and the numerator current $I_n$. DAC 45 may also be referred to as a reference current generator.

The DAC 45 comprises an input for an n-bit digital datum $D_{in}$<n . . . o> and supplies at output the complementary current $I_n$ to a first current mirror MR1 and the denominator current of programmable value $I_d$ to a second current mirror MR2. The first current mirror MR1 mirrors the current $I_n$ towards a sum node SN, flowing into which is also the current mirrored by the second current mirror MR2, thus obtaining the current $I_d + I_n$, and consequently providing the output biasing-current generator 34, whereas a current mirror in parallel MR3 mirrors the current $I_d$ towards a further output, consequently providing the input biasing-current generator 32.

The same circuit that enables selection of the gain provides matching between the ratio of the currents that determine the gain.

The DAC 45 is linear, with linear variation of gain, where there is, for example:

$$I_n = ((D_{in<n-1:0>})/2^n)I_{ref}$$

$$I_d = ((2^n - D_{in<n-1:0>})/2^n)I_{ref}$$

where $I_{ref}$ is an analog reference current used by the DAC 45 for carrying out the conversion (in a way in itself known, for example using a DAC of a current-steering type), not illustrated in the figure. It may be seen from the above relations how $I_n$ and $I_d$ are complementary. In alternative embodiments, the function of DAC 45 may be replaced by other types of circuits configured to provide complimentary currents $I_n$ and $I_d$. For example, analog circuitry (e.g. current mirrors) may be used to provide continuous gain control.

Figure 5:
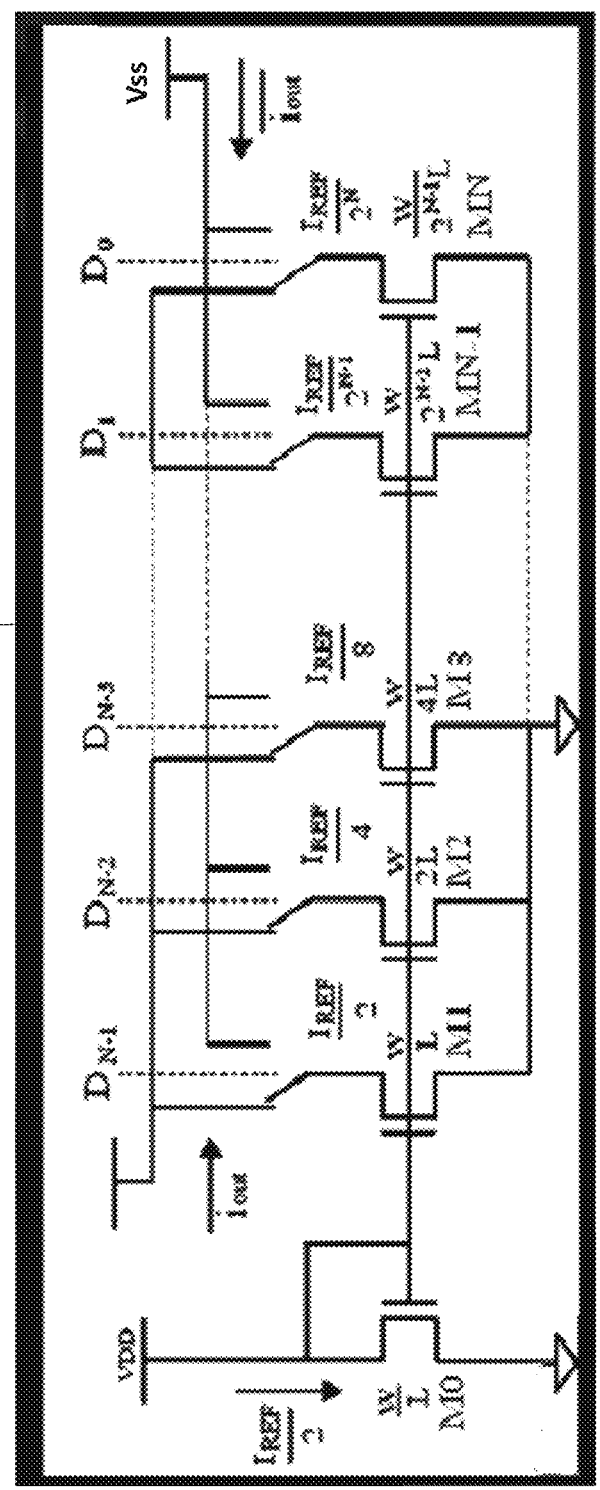
FIG. 5 illustrates a diagram of implementation of the circuit of FIG. 4.

FIG. 5 shows an embodiment of the DAC 45 of a current-steering type, in which a plurality of current mirrors is formed, where one branch is constituted by the diode-connected MOSFET Mo, with aspect ratio W/L, in which a current $I_{ref}/2$ flows, connected in parallel to which are n MOSFETs M1, . . . , Mn with aspect ratio decreasing from W/L; W to W/$2^{n-1}$L; i.e., each successive transistor determines an output current halved from $I_{ref}/2$ to $I_{ref}/2^n$. Hence, in particular, the aforesaid DAC 45 is of a binary type in so far as the output currents have values according to powers of 2 distinct according to the bit selected.

Each of the aforesaid currents can be connected, via a respective switch Dn−1, . . . , Do, either to the output terminal on which the current $I_n$ is picked up, or else to the output terminal on which the current $I_d$ is picked up.

The digital input $D_{in}$ corresponding to the desired gain determines the state of each of the switches Do, . . . , Dn−1 and hence the level of the two output currents $I_n$ and $I_d$. It may be noted how, irrespective of the code of the digital input $D_{in}$, the sum of the two output currents remains constant and equal to $I_{ref}$, the gain being given by the ratio of $I_d + I_n$ over $I_d$. It follows that any imprecision/imperfection within the DAC 45 with respect to ideality is transferred proportionally to the numerator and to the denominator of the gain, thus achieving a substantial immunity of the latter with respect to the imperfections/imprecisions during operation of the circuit and/or due to the production process.

To obtain a precise gain of the Gilbert cell it is necessary to be able to set a precise collector current $I_C$. The reason for this is that the transconductance of a bipolar transistor is defined as $g_m = I_C/V_T$, where $V_T$ is the threshold voltage of the bipolar transistor. Forcing a collector current $I_C$ may not be easy because the collector has a high impedance. Hence, according to a further embodiment, it is envisaged to force an emitter current $I_E$ of given value on each of the transistors T1 and T2 of FIG. 2 or FIG. 3 in order to obtain the required collector current $I_C$.

Figure 6B:
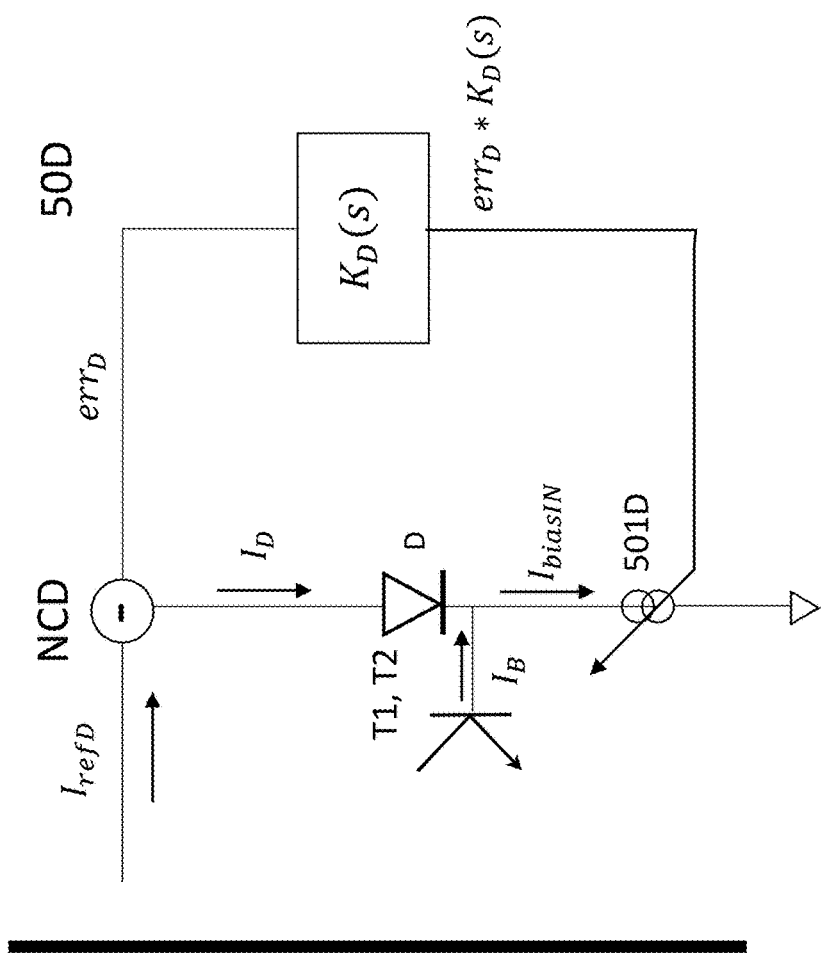
FIGS. 6A and 6B illustrate additional biasing circuits that can be used in a circuit arrangement according to embodiments.
Figure 6A:
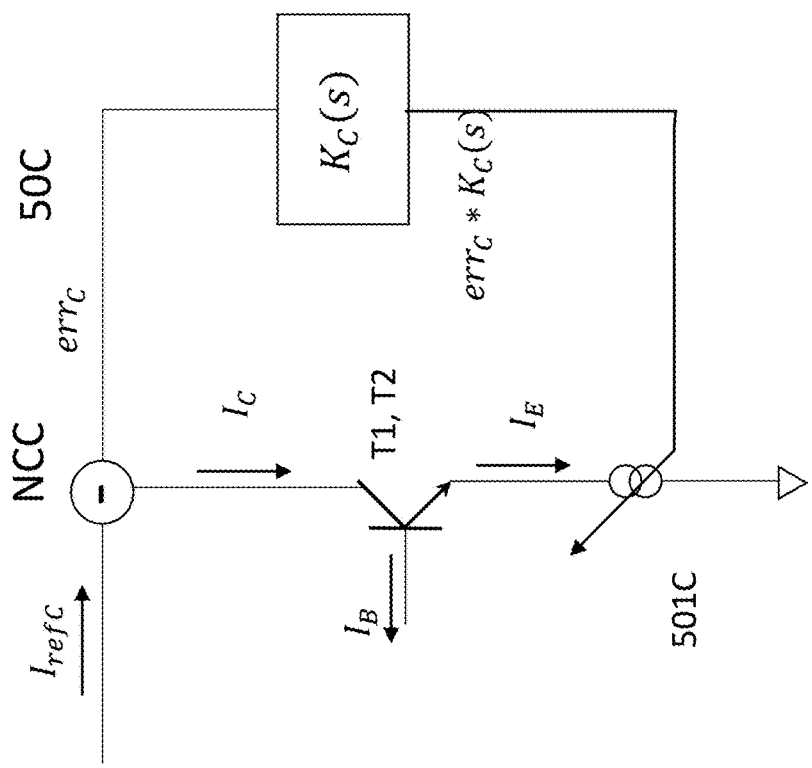

With reference to FIG. 6A, which shows a block diagram of a biasing subsystem of the output stage 50C, in order to force the aforesaid emitter current $I_E$ a circuit is used for biasing the transistors T1 and T2 that comprises a reference current $I_{refC}$ that is to be forced as the same collector current $I_{C1}$, $I_{C2}$, on the two transistors T1 and T2, supplied by a generator (not illustrated), which is sent to a comparison node NCC, where, in particular, a subtraction is made, to obtain an error $err_C$ (difference) between an effective collector current $I_{C1}$, $I_{C2}$, and the reference current $I_{refC}$, the error $err_C$ being supplied to a block that applies a gain $K_C(s)$, which is a transfer function where s is the variable in the Laplace domain, to amplify the error $err_C$. The output of the gain block $K_C(s)$ is supplied as control signal to a current generator 501C, which is hence controlled by the amplified error $err_c$ and which is coupled to the emitters of T1 and T2 and simultaneously forces the emitter current $I_{E1}$, $I_{E2}$, on the two transistors T1 and T2 so as to bring the error to zero.

To obtain a precise gain of the Gilbert cell in the diagram of FIG. 1 or FIG. 3 it is likewise necessary to be able to set a precise diode current $I_d$. This through the transconductance of the diode, likewise defined as $g_m = I_d/V_T$, where $V_T$ is the threshold voltage of the diode D1, D2.

Forcing a precise diode current is not easy either, in so far as part of the biasing current ends up in the base of the transistor T1, T2 (especially for a beta factor β of the bipolar transistor that is not particularly high) connected to the diode D1, D2 so that the diode comes to be biased at a current different from the design current.

The embodiment described herein envisages, in some embodiments, forcing an appropriate biasing current of the input stage in such a way as to guarantee the diode current $I_{D1}$, $I_{D2}$ required on each diode D1, D2.

With reference to FIG. 6B, which shows a block diagram of a diode-biasing subsystem 50B, a reference current $I_{refD}$ that is to be forced in each of the two diodes D1, D2 is supplied to a comparison node NCD to obtain the error $err_D$ (difference) between the effective diode current $I_D$ and the reference current $I_{refD}$, the error $err_D$ being supplied to a block that applies a gain $K_D(s)$, which is a transfer function where s is the variable in the Laplace domain, to amplify the above error $err_D$. The output of the gain block $K_D(s)$, is supplied as control signal to a current generator 501D, which is hence controlled by the error $err_D$, amplified, that forces the biasing current $I_{biasIN}$ into each of the two branches of the input stage 21 or 31 in such a way as to bring the error $err_D$ to zero.

Figure 7:
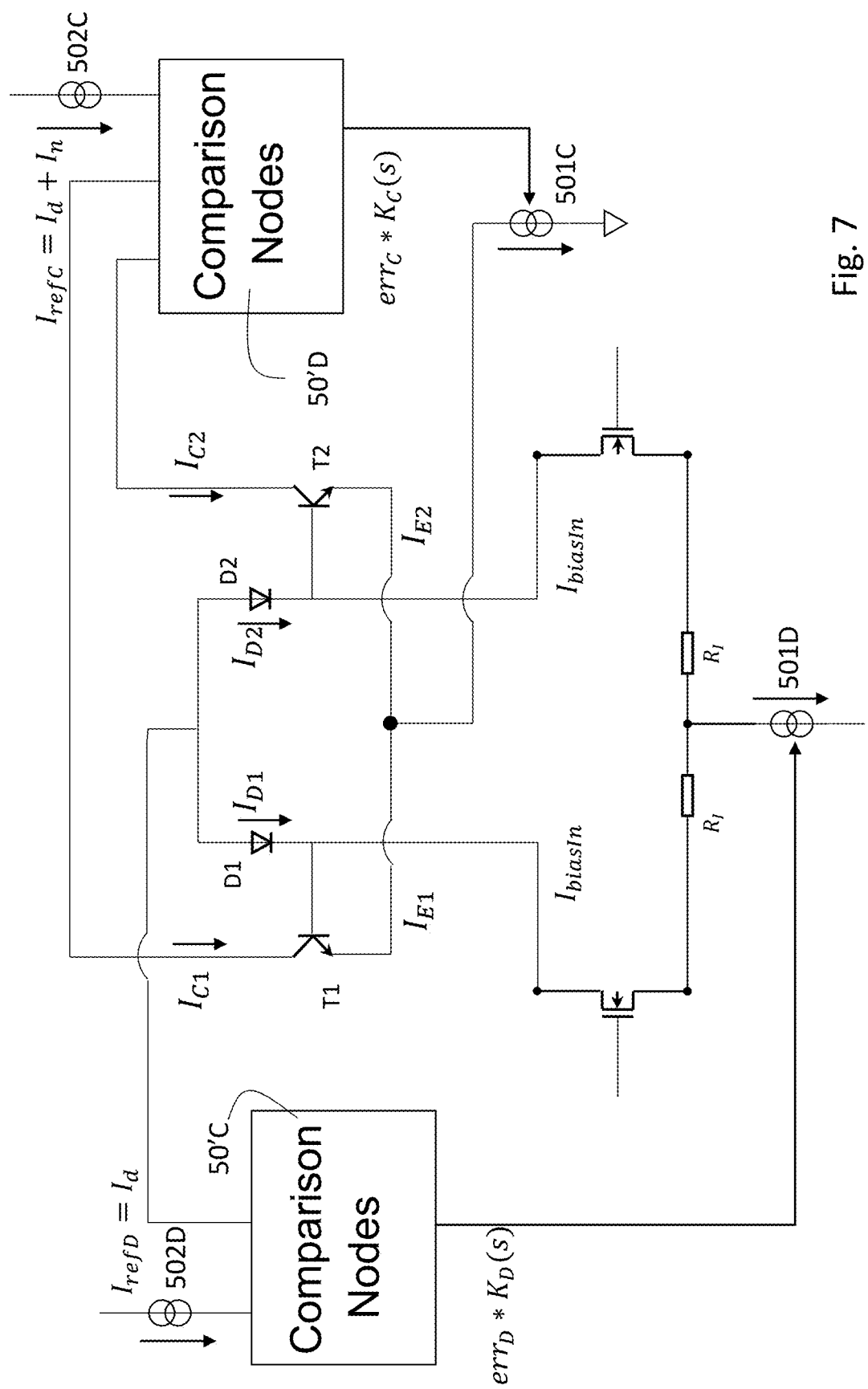
FIG. 7 is a schematic illustration of a circuit arrangement according to embodiments that is associated to the additional biasing circuits of FIGS. 6A and 6B.

Illustrated in the subsequent FIG. 7 is a possible embodiment of the gain-controlled amplifier 50, provided with a fine-biasing system 50C, 50D. Each of the two blocks 50'C, 50'D represents the ensemble of the respective comparison nodes NCC, NCD and of the gain blocks $K_C(s)$, $K_D(s)$, which supply the amplified errors, $err_C*K_C(s)$ for the transistors and $err_D*K_D(s)$ for the diodes, understood as difference between the desired biasing current or reference current ($I_{refC} = I_d + I_n$ for the transistors and $I_{refD} = I_d$ for the diodes) and the effective current which instantaneously flows in the element to be biased ($I_{C1}$, $I_{C2}$ for the transistors and $I_{D1}$ and $I_{D2}$ for the diodes) and on which there is applied a transfer function/gain denoted as $K_C(s)$ for the transistors and as $K_D(s)$ in the domain of the Laplace transform. The other elements of the circuits 50C and 50D of FIGS. 6A and 6B are illustrated explicitly, in particular, the reference-current generators 502C and 502D that generate the reference currents $I_{refC}$, $I_{refD}$ respectively, which are sent to the comparison nodes NCC, NCD in blocks 50'C, 50'D. The collector currents $I_{C1}$ and $I_{C2}$ are sent at input to the block 50'C (coupled to the collector electrodes of the transistors T1 and T2), whereas the diode currents $I_{D1}$ and $I_{D2}$ are sent at input to the block 50'D (which is coupled to their anodes).

The controlled current generator 501C of the biasing circuit of the output stage 50C corresponds to the biasing-current generator 24 or 34 of the output stage 23 or 33, which, in this case, becomes a current generator controlled by the output of the block 50'C, i.e., $err_C*K_C(s)$. The controlled current generator 501C of the diode-biasing circuit 50D corresponds to the biasing-current generator 22 or 32 of the input stage 21 or 31, which in this case becomes a current generator controlled by the output of the block 50'D, i.e., $err_D*K_D(s)$.

The circuitry of blocks 50C and 50D or 50'C and 50'D or other circuitry that controls the currents of current sources 501D and 501C may be referred to as a current control circuit. Moreover, the circuitry of blocks 50C and 50'C may be said to form an input-stage control loop, and the circuitry of blocks 50D and 50'D may be said to form an output stage control loop.

The sum of collector currents $I_{C1}$ and $I_{C2}$ may be referred to as a common-mode output current of transistors T1 and T2 (which form a differential pair of transistors). Thus, the sum of collector currents $I_{C1}$, $I_{C2}$, on the two transistors T1 and T2 may be made to be substantially equal to the reference current $I_{refC}$ within practical implementation limits such as device mismatch and finite amplifier gain using block 50C or 50'C. Similarly, the sum of diode currents $I_{D1}$ and $I_{D2}$ may be referred to as the common-mode output current of diodes D1 and D2 (which form a pair of diodes). Thus, the sum of diode currents $I_{D1}$, $I_{D2}$, on didoes D1 and D2 may be made to be substantially equal to the reference current $I_{refD}$ within practical implementation limits such as device mismatch and finite amplifier gain using block 50D or 50'D.

Figure 8:
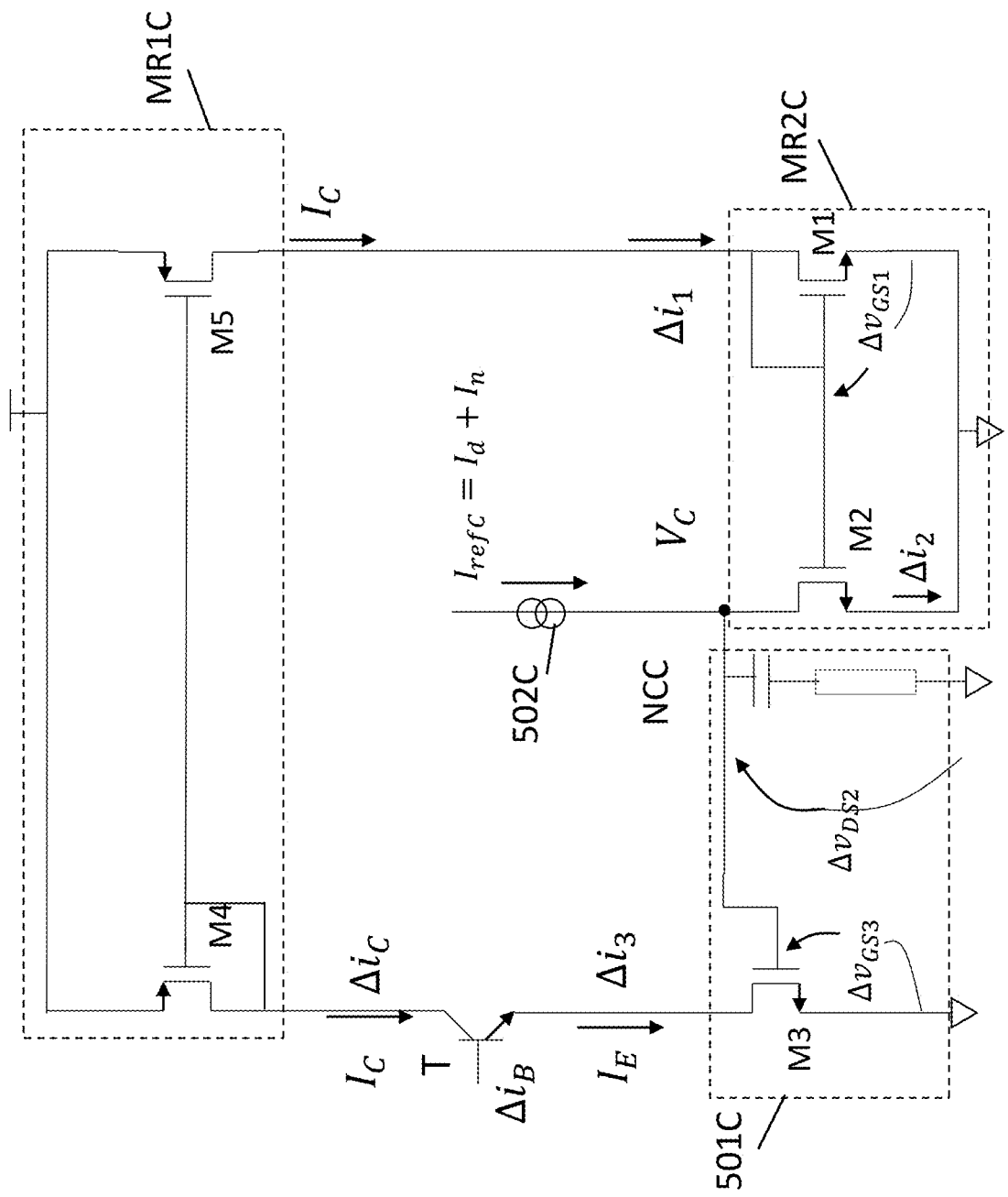
FIG. 8 shows a detailed diagram of the additional circuit of FIG. 6A.

FIG. 8 illustrates a possible implementation of the input-stage biasing loop 50C.

The circuit 50C is represented for the transistor T, which may be either T1 or T2. The collector current $I_C$ from the collector is mirrored by a current mirror MR1C, formed by a diode-connected MOSFET M4 and a MOSFET M5, the transistors, which are p-channel transistors, having their sources coupled to the supply voltage $V_{dd}$, into a comparison branch at input to a second current mirror MR2C, formed by a diode-connected MOSFET M1 and a MOSFET M2, the transistors, which are n-channel transistors, having their sources coupled to the ground voltage. At output from the second current mirror, the aforesaid current $I_C$ is mirrored towards a node that may be referred to as the comparison node NCC, which receives the reference current $I_{refC} = I_d + I_n$ from the current generator 502C. Consequently, an output branch from the aforesaid node NCC yields a current that is the difference between the two currents, hence the current error $err_C$. Coupled to the node NCC is the gate of a MOSFET M3 representing the current-controlled generator 501C, the drain of which is coupled to the emitter of the transistor T. A series RC circuit, Cc+Rc, is set in parallel to the gate, thus bringing about a control voltage drop $\Delta V_{DS2}$ that controls the MOSFET M3, which represents the current-controlled generator 501C.

As may be shown, the point of equilibrium of this circuit 50C, which represents a control loop, is the one in which the current $I_C$ that flows in the collector of the transistor T and hence—as a result of the mirror MR1C—in the comparison branch is equal to the reference current $I_{refC} = I_d + I_n$. Assuming that we start from that condition of equilibrium and that for any circumstance the collector current $I_C$ varies with respect to the reference current $I_{refC}$ by a variation $\Delta i_C$ it may be seen how this reflects upon the control voltage $\Delta V_{DS2}$. In the small-signal regime and assuming that the transistors M1, M2 and M3 are in a condition of saturation, the analysis can be developed as described in what follows.

As a result of the current-mirror arrangement MR1C, $\Delta i_1 = \Delta i_C$.

The perturbation $\Delta i_1 = \Delta i_c$ is impressed on the drain terminal of the transistor M1, which, as a result of the shorting between drain and source, causes a variation in the gate-to-drain voltage $\Delta v_{GS1}$ equal to $$\Delta i_1 \rightarrow \Delta v_{GS1} = \frac{\Delta i_1}{g_{m1}}.$$

Given the gate connection between the transistors M1 and M2 in the current-mirror arrangement MR2C, we have $\Delta V_{GS2} = \Delta V_{GS1}$ so that the variation of the gate-to-source voltage $\Delta V_{GS2}$ of the transistor M2 causes a variation of the drain-to-source voltage $\Delta v_{DS2}$ given by:

$$\Delta v_{DS2} \sim \left(-g_{m2}\left(Rc + \frac{1}{SCc}\right)\right)\Delta v_{GS1}.$$

$$\Delta V_{GS3} = \Delta V_{DS2}\Delta v_{GS3}\Delta v_{GS3} \sim \left(-g_{m2}\left(Rc + \frac{1}{SCc}\right)\right)\Delta v_{GS1}$$

Given the connection between M2 and M3, we have so that the variation of the drain-to-source voltage of the transistor M2 causes a variation in the gate-to-source voltage $$\Delta V_{GS3} = \Delta V_{DS2}\Delta v_{GS3}\Delta v_{GS3} \sim \left(-g_{m2}\left(Rc + \frac{1}{SCc}\right)\right)\Delta v_{GS1}$$

$$\frac{\Delta i_3}{g_{m3}} \sim \left(\left(-g_{m2}\left(Rc + \frac{1}{SCc}\right)\right)\right)\frac{\Delta i_1}{g_{m1}}.$$

It may be noted that, as a result of the connection between the transistors M3 and M2, the transistor M3 functions as a voltage-controlled current generator, in particular controlled by the voltage $V_{DS2}$, thus providing the generator 501C of FIGS. 6A and 7.

We then have, for the current of the generator 501C denoted by $i_3$, $$i_3 = \left(g_{m2}\left(Rc + \frac{1}{SCc}\right)\right)\frac{gm3\Delta i_1}{g_{m1}}.$$

Assuming the MOSFETs M1, M2, M3 as being all the same, the variation of current for the current of the generator 501C is $$\Delta i_3 = \left(g_m\left(Rc + \frac{1}{SCc}\right)\right)\Delta i_1.$$

It is possible to distinguish a first contribution proportional to the error/disturbance signal and a contribution basically linked to the integral of the error.

There is obtained a first contribution of controlled current $\Delta i_3$, which is proportional to the error/perturbation signal $\Delta i_1$ according to the gain factor, which is basically equal, the MOSFETs being all the same, to $g_m r_{DS} \gg 10$ and has a sign opposite to that of the perturbation so that the loop 50C will compensate the error and progressively tend to bring it to zero:

For low frequencies: $\left(g_m\left(Rc + \frac{1}{SCc}\right)\right) \rightarrow gm/SCc$ (integration term)

For high frequencies: $\left(g_m\left(Rc + \frac{1}{SCc}\right)\right) \rightarrow gm\ Rc$ (proportional term).

Figure 9:
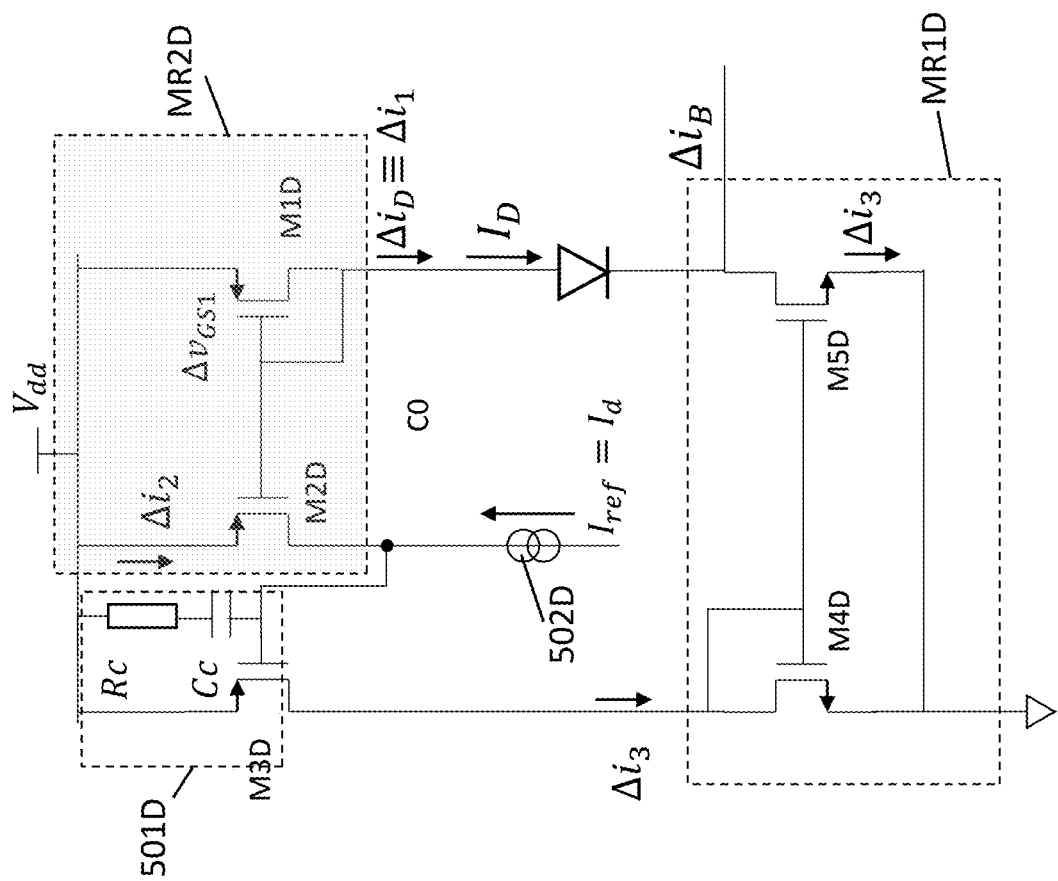
FIG. 9 shows a detailed diagram of the additional circuit of FIG. 6B.

Illustrated in FIG. 9 is a possible implementation of the diode-biasing loop 50D. The circuit 50C is represented for the diode D, which may be either D1 or D2. The diode current $I_D$ from the cathode of the diode D is mirrored by a current mirror MR2D, formed by a diode-connected MOSFET M1D and a MOSFET M2D, which are p-channel MOSFETs with sources connected to the supply voltage. At output from the current mirror MR2D, at the drain of the MOSFET M2D, the aforesaid diode current $I_D$ is mirrored towards a node that may be referred to as the comparison node NCD, which receives the reference current $I_{refD} = I_d$ from the generator 502D. Consequently, an output branch from the above node NCD yields a current that is the difference between the two currents, and hence the current error err$_c$. At output from the second current mirror MR2D, the aforesaid diode current $I_D$ is mirrored towards a node that may be referred to as the comparison node NCD, which receives the reference current $I_{refD} = I_d$. Consequently, an output branch from the node NCD yields a current that is the difference between the two currents, and hence the current error err$_D$. Coupled to the node NCD is the gate of a MOSFET M3D, which represents the current-controlled generator 501D, the drain of which is coupled to the cathode of the diode D through a current mirror MR1C, formed by a diode-connected MOSFET M4D and a MOSFET MSD, the transistors, which are n-channel transistors, having their sources coupled to the ground voltage. The source of the MOSFET M3D, which is a p-channel MOSFET, is connected to the supply voltage, while the drain is connected to the drain of the NOSFET M4D. A series RC circuit, Cc+Rc, is set in parallel to the gate of the transistor M3D, between the node NCD and ground, bringing about on itself a control voltage drop that controls the MOSFET M3D that represents the current-controlled generator 501D.

Following the same considerations developed for the circuit 50C, it may be shown that the relation between the control current and the error/disturbance current is also in this case equal to that of the transistor-biasing loop 50C.

Assuming that the MOS transistors M1, M2, M3 are all the same, the current variation $\Delta i_3$ for the current of the current generator 501D is:

$$\Delta i_3 = \left(g_m\left(Rc + \frac{1}{SCc}\right)\right)\Delta i_1$$

Figure 10:
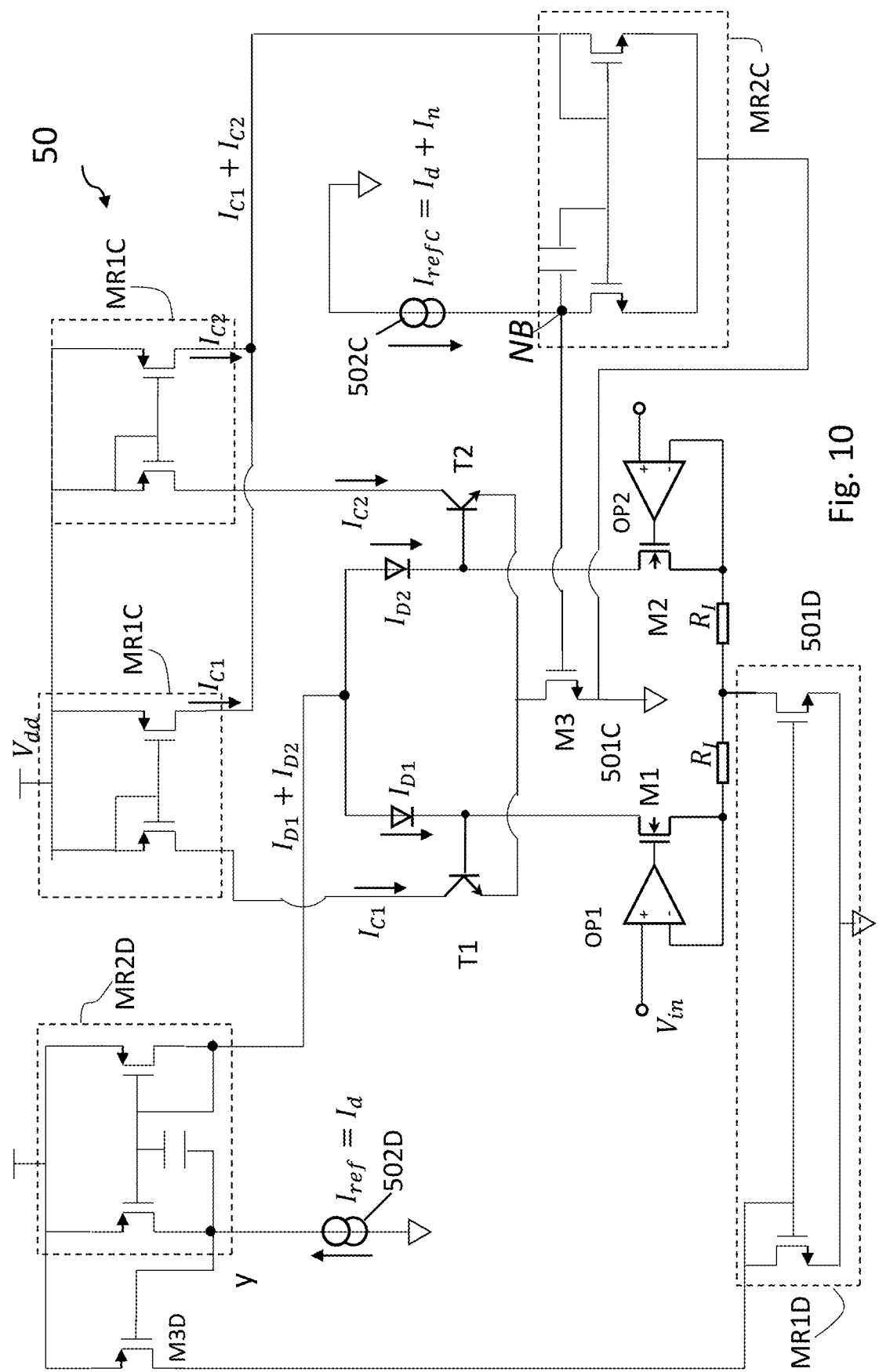
FIG. 10 illustrates a detailed diagram of a circuit arrangement according to embodiments that is associated to the additional circuits of FIGS. 8 and 9.

Hence, illustrated in FIG. 10 is an overall diagram of the circuit 50 of FIG. 7, with the implementations of FIGS. 8 and 9, where the biasing of the diodes D1 and D2 is fixed by the denominator current $I_d$. As may be seen, for each of the transistors T1 and T2, a respective current mirror MR1C is used on the respective collector to convey the collector currents at input to the mirror MR2C.

A node designated by NA, corresponding to the comparison node NCD, which is subject to high gain, imposes a current equal to the denominator current $I_d$ through the loop 50D. The node NB, corresponding to the comparison node NCC, which subject to high gain, imposes a current equal to the sum current $I_d+I_n$ through the loop 50C. The output biasing depends upon the sum current $I_d+I_n$. The transconductance $g_m$ of the transistors T1, T2 depends only upon the collector currents, which are fixed and independent of the beta factor β of the transistors T1, T2 used.

The amplification circuit with current-controlled gain 30, 40 or 50 may present a further criticality, due to a gain error. The factor β of the transistors, which are bipolar transistors, for example BCDs (Bipolar CMOS DMOS), may be very low (for example, between 30 and 50). In this case, the base current of the transistors T1 and T2 subtracts current from the diodes D1 and D2, which hence have a current lower than $I_{bIN}/2$, leading to a gain error that depends upon the factor β, as shown by the foregoing equations. Given that the factor β markedly depends upon temperature, as well as upon the collector current itself, it emerges that the expected gain could undergo substantial variations during the service life of the device.

Figure 11A:
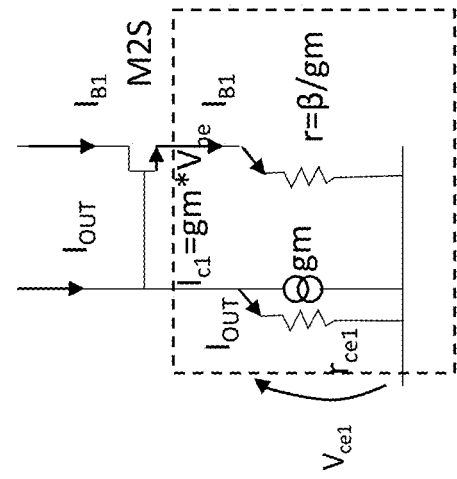
FIG. 11A is a schematic illustration of a compensation circuit that can be associated to the circuit arrangement according to embodiments.

In this regard, FIG. 11A shows a further circuit 60 for recovery and compensation of the base current of the bipolar transistors T, T1, and T2, which also enables compensation of the difference of the base currents due to an unbalancing of the input signal.

The Gilbert cell with bipolar transistors presents in fact intrinsically a limit due to the base current, $I_B$ in FIG. 1, of the bipolar transistors due to the finite beta factor. Above all, in BCD technology the beta factor β may assume values lower than 100. Moreover, the base currents $I_{B1}$, $I_{B2}$ may differ between the two transistors T1, T2 when a differential signal is applied, giving rise to behaviours that are not easily predictable. For instance, if the beta factor β has a value 100 and $I_C=100 \cdot I_d$, the base current is $I_B=I_C/100=I_d$, thus committing an error of 50% on the gain of the Gilbert cell. To overcome this drawback, a circuit 60 is applied to the amplifier with controlled gain, in particular current-controlled gain, 20, 30, 40, 50, to compensate for the individual base currents of the bipolar transistors T1 and T2.

In FIG. 11A, the transistor B2 represents each individual transistor of the output stage 23, whether T1 or T2, which is consequently traversed by the output current $I_{OUT}$, which corresponds to the collector current $I_{C1}$ or $I_{C2}$ of the bipolar transistor T1 or T2 of which the base current is to be compensated so as to provide a so-called super-beta virtual transistor.

The compensation circuit designated by 60 comprises a reference component that normally is used as amplifier, the transistor B2 that corresponds to T1 or T2, and a supporting component, the transistor B1 forced to work in the same working conditions as the transistor B2, a loop L1 used to force the operating condition of the supporting transistor B1, which comprises the transistor B1, and a current mirror MR1S, comprising MOSFETs M1S (which is diode-connected) and M2S. The source electrode of the transistor M1S is coupled to the emitter of the supporting transistor B1, and the gate of the supporting transistor B1 is coupled to the source of M2S.

The transistor B1 (or T1, T2) receives on its collector a copy of the output current of the transistor B2, $I_{OUT}$, via a p-channel current mirror MR2S coupled to the branch in which there flows the current $I_{OUT}$ that traverses the reference transistor B2 and as output the base current $I_{B1}$ which in turn is mirrored on the base of the transistor B2 by a p-channel current mirror MR3S. A mirror M4RS in parallel to the current mirror M3RS supplies the output current of the amplifier.

The base current $I_{B1}$ of the transistor B1 is linked to the collector current $I_{C1}$ of the transistor B1 via the beta factor of the transistor B1. The collector of the supporting transistor B1 represents a comparison node (with high impedance and hence high gain), between the current $I_{OUT}$ and its collector current $I_{C1}$.

The difference between these currents ($I_{OUT}-I_{C1}$) sets up a collector-to-emitter voltage $V_{CE1}$ on the collector-to-emitter resistance $R_{CE1}$ of the transistor B1 (which has a normally very high value), the above collector-to-emitter voltage $V_{CE1}$ being used for controlling the base current $I_{B1}$ of the transistor B1 via the MOSFET M2S, thus forming a negative loop with inversion of sign on the collector of the transistor B1. The MOSFET M2S forces a base current such that the collector current $I_{C1}$ is equal to the current $I_{OUT}$, thanks to the negative loop comprising the base current $I_{B1}$, the collector current $I_{C1}$, and the collector-to-emitter voltage $V_{CE1}$ of the transistor B1. The collector of the transistor B1 thus represents a gain point.

The wide operating dynamics is guaranteed by the fact that the bipolar transistors B1 and B2 work with a collector-to-emitter voltage $V_{CE}$ equal to the base-to-emitter voltage $V_{BE}$. In fact, $V_{CE2}=V_{BE1}+V_{GS2}-V_{GS2}=V_{BE1}$ (given that the currents $I_{C1}$ and $I_{C2}$ are equal). Also $V_{CE1}=V_{BE1}+V_{GS2}-V_{GS1}=V_{BE1}$.

Figure 11B:
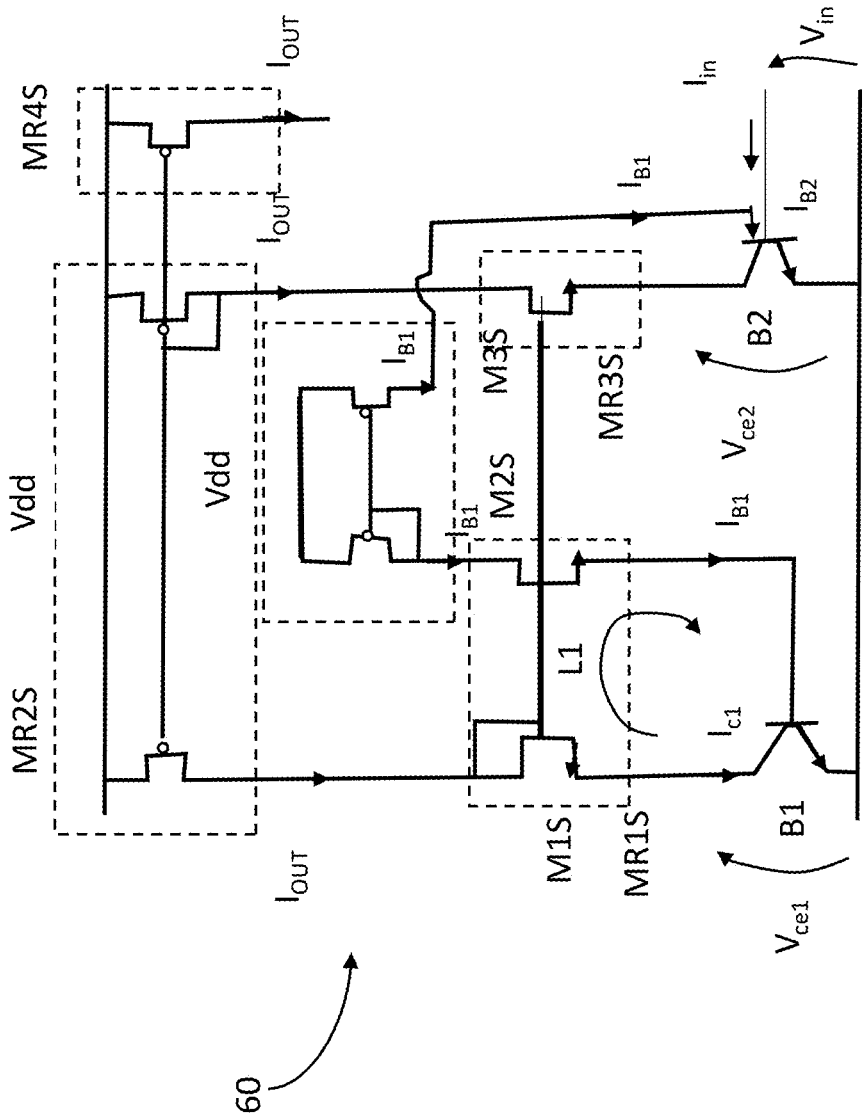
FIG. 11B is a schematic illustration of a detail of the above compensation circuit.

In FIG. 11B the supporting transistor B1 is represented by the small-signal model. Denoted by r is the dynamic input resistance traversed by the base current $I_{B1}$ coming from the transistor M2S and is, in particular, equal to $β/g_m$. A current-controlled generator $g_m \cdot V_{BE}$, $1_{C1}$, between the collector and the emitter has, in parallel between the collector and ground, the collector-to-emitter resistance $r_{CE1}$. It may be shown that the following relation applies:

$I_{B1}=I_{OUT}/β_1=I_{B2}$.

$I_{B1}I_{B2}$ The compensation circuit 60 applied to the transistors T1 and T2 of the circuits 30, 40, 50 affords the following features:

$I_{B1}I_{B2}$ wide operating dynamics; and $I_{B1}I_{B2}$ equality between the respective voltages of B1 and B2; this means that the precision of cancelling-out of the base current of the transistor B2 will be very high: there is thus obtained a practically zero net current at input (−=0).

Figure 12A:
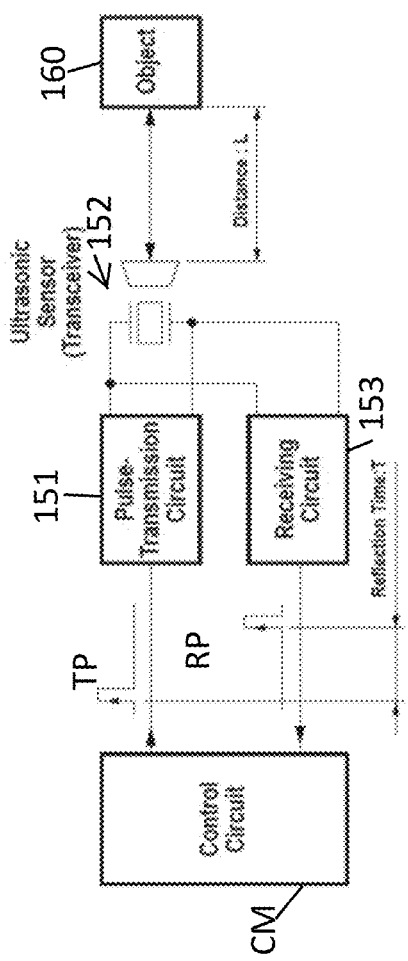
FIG. 12A is a schematic illustration of an ultrasonic obstacle detector comprising the circuit arrangement described herein.

Illustrated schematically in FIG. 12A is an ultrasonic obstacle detector 150, comprising a pulse transmitter 151, which drives, via its own pulses, a piezoelectric transducer 152, which is an ultrasound transceiver; i.e., it both transmits ultrasounds and receives them, for example via a piezoelectric membrane, and operates under the control of transmission-control pulses TP sent by a control circuit, to emit ultrasound pulses, i.e., pressure-wave pulses.

Also illustrated in FIG. 12A is an object 160 at a distance L, which reflects the ultrasound waves associated to the ultrasound pulses, which are then detected by the piezoelectric transducer 152 itself, the output of which is sent to a receiver circuit 153. The receiver circuit 153 then sends reception-control pulses RP to the control circuit CM, which measures the difference in time T between the transmission-control pulses TP and the reception-control pulses TP. The difference in time T is also known as time of flight. Knowing the rate of propagation of the ultrasound pulses, it is possible to determine the distance L.

Figure 12B:
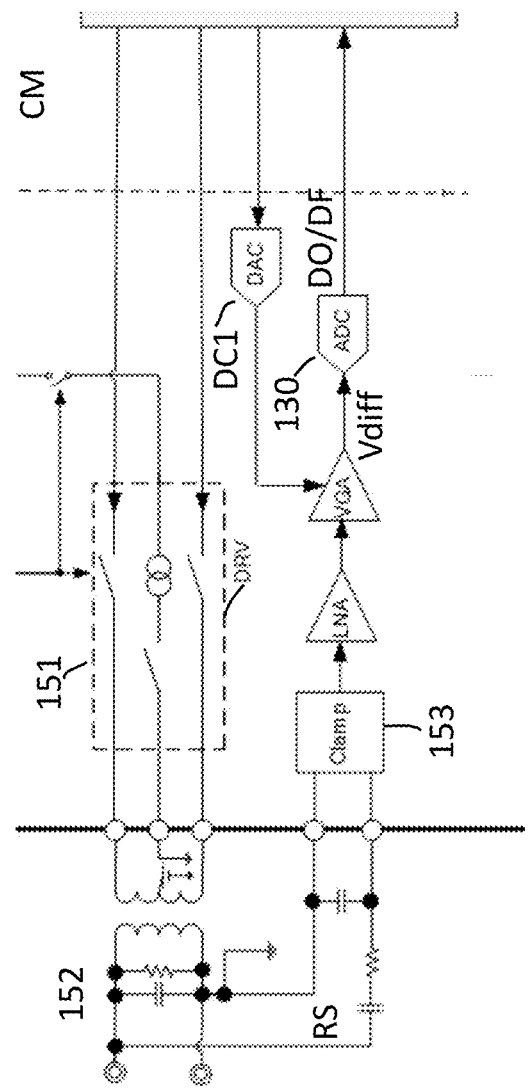
FIG. 12B illustrates a partial detailed block diagram of the detector of FIG. 12A.

FIG. 12B shows a partial block diagram of the ultrasonic obstacle detector 150, which comprises the transducer 152, which is represented schematically as a parallel RC circuit, which is driven by the pulse transmitter 51, to which it is coupled via a transformer. The transducer 152 is also coupled in reception to the receiver circuit 153, a receiver of the ultrasound sensor, in its turn an analog-to-digital converter (ADC) 130.

Hence, in FIG. 12B, an ultrasound signal received RS, which is an analog differential signal, is transmitted via a signal chain comprising a clamp circuit CP, followed by a low-noise amplifier LNA and then by a variable-gain amplifier VGA, the gain of which is controlled by the control module CM through a digital-to-analog converter DC1 and which supplies a differential voltage Vdiff at input to the ADC 130. A digital output DO of the ADC 130, or a filtered version thereof, the filtered digital output DF, which may in general comprise the reception-control pulses RP, is supplied to the control module CM, which, as has been said, is configured for computing the distance L from the object 160 on the basis of the time of flight T of the ultrasonic pulses between the transmitter 151 and the receiver 153.

Hence, through the stimulation of a piezoelectric transducer it is possible to transmit ultrasound waves that can be detected thereby for obstacle recognition. The increase in the transmission distance and the use of specific modulations enable an increase in the performance of the ADAS (Advanced Driver Assistance System) applications for the automotive market. The evolution of the base systems already present makes it possible to pass from diagnostics to assisted/automatic driving.

Ultrasonic obstacle-detection systems may be used to manage problems of environmental interference and of detection systems of adjacent vehicles. However, wind and rain may attenuate and disturb the transmitted signal. Accordingly, pulses coming from adjacent vehicles may give rise to false diagnostics and detection. It is possible to modulate the transmitted signal (above all for distances greater than one metre) to render the latter recognizable during reception. It is difficult, in particular, to provide a system capable of recognizing simultaneously objects that are far away and nearby. Detecting signals reflected by nearby and distant obstacles requires a wide reception range.

A gain control like that of the VGA of FIG. 12B enables conversion of the signal received with an ADC with a conversion range that is small than what is actually necessary.

Embodiments described hence affords various advantages over the solutions of the prior art. Embodiment circuit-arrangements described makes it possible to obtain a variable-gain stage with high gain precision. Moreover, a compact architecture is achieved using a differential current DAC. Embodiment circuit arrangements described likewise makes it possible to obtain a biasing that is independent of the gain.

Of course, without prejudice to the underlying principles of the invention, the details of construction and the embodiments may vary, even appreciably, with respect to what has been described and illustrated herein purely by way of example, without thereby departing from the scope of the present invention, as defined by the ensuing claims.

What is claimed is:

1. A circuit, comprising:
a variable gain amplifier comprising:
a first differential transistor pair coupled to a signal input,
a first current source configured to provide a first bias current to the first differential transistor pair,
a pair of diodes coupled to an output of the first differential transistor pair,
a second differential transistor pair having an input coupled to the pair of diodes,
a second current source configured to provide a second bias current to the second differential transistor pair, and
a current control circuit coupled to a first reference current input, a second reference current input, the first current source and the second current source, the current control circuit configured to cause a common-mode output current of the pair of diodes to be substantially equal to a first reference current provided at the first reference current input, and a common-mode output current of the second differential transistor pair to be substantially equal to a sum of the first reference current and a second reference current provided at the second reference current input.

2. The circuit of claim 1, further comprising a reference current generator coupled to the first reference current input and the second reference current input and configured to provide the first reference current and the second reference current to the current control circuit, to control a gain of the variable gain amplifier by modifying the first reference current and the second reference current, and to keep the sum of the first reference current and the second reference current constant over a plurality of gain settings.

3. The circuit of claim 2, wherein the reference current generator comprises a digital-to-analog converter (DAC).

4. The circuit of claim 3, wherein the DAC is a differential DAC having a first differential output configured to provide the first reference current and a second differential output configured to provide the second reference current.

5. The circuit of claim 1, wherein the second differential transistor pair comprises a plurality of bipolar transistors.

6. The circuit of claim 5, further comprising a base current compensation circuit configured to recover and compensate base currents of the plurality of bipolar transistors.

7. The circuit of claim 6, wherein the base current compensation circuit comprises, for each respective bipolar transistor of the plurality of bipolar transistors:
a supporting bipolar transistor; and
control loop coupled to the supporting bipolar transistor and the respective bipolar transistor, the control loop circuitry comprising:
a first current mirror having an input coupled to a collector of the respective bipolar transistor, and an output coupled to a collector of the supporting bipolar transistor, and
a second current mirror having an input coupled to a base of the supporting bipolar transistor and an output coupled to a base of the respective bipolar transistor.

8. The circuit of claim 5, wherein the pair of diodes comprises a plurality of diode-connected transistors.

9. The circuit of claim 1, wherein the first differential transistor pair comprises a resistor degenerated MOSFET differential pair.

10. The circuit of claim 9, wherein each differential branch of the first differential transistor pair comprises an amplifier having an output coupled to a gate of a respective MOSFET of the resistor degenerated MOSFET differential pair, a first input coupled to a source of the respective MOSFET, and a second input coupled to a corresponding input of the signal input.

11. The circuit of claim 1, wherein the current control circuit comprises an output-stage control loop configured for controlling the second current source to regulate the common-mode output current of the pair of diodes.

12. The circuit of claim 1, wherein the current control circuit comprises an input-stage control loop configured for controlling the first current source to regulate the common-mode output current of the pair of diodes to be substantially equal to the first reference current.

13. An ultrasonic obstacle detector having a receiver comprising:
a variable gain amplifier comprising:
a first differential transistor pair coupled to a signal input,
a first current source configured to provide a first bias current to the first differential transistor pair,
a pair of diodes coupled to an output of the first differential transistor pair,
a second differential transistor pair having an input coupled to the pair of diodes,
a second current source configured to provide a second bias current to the second differential transistor pair, and
a current control circuit coupled to a first reference current input, a second reference current input, the first current source and the second current source, the current control circuit configured to cause a common-mode output current of the pair of diodes to be substantially equal to a first reference current provided at the first reference current input, and a common-mode output current of the second differential transistor pair to be substantially equal to a sum of the first reference current and a second reference current provided at the second reference current input; and
a reference current generator coupled to the first reference current input and the second reference current input and configured to provide the first reference current and the second reference current to the current control circuit, to control a gain of the variable gain amplifier by modifying the first reference current and the second reference current, and to keep the sum of the first reference current and the second reference current constant over a plurality of gain settings.

14. The ultrasonic obstacle detector of claim 13, wherein:
the second differential transistor pair comprises a plurality of bipolar transistors; and
the pair of diodes comprises a plurality of diode-connected transistors.

15. The ultrasonic obstacle detector of claim 14, wherein the first differential transistor pair comprises a resistor degenerated MOSFET differential pair.

16. The ultrasonic obstacle detector of claim 13, wherein the reference current generator comprises a digital-to-analog converter (DAC) having a first differential output configured to provide the first reference current and a second differential output configured to provide the second reference current.

17. The ultrasonic obstacle detector of claim 13, wherein the current control circuit comprises:
an output-stage control loop configured for controlling the second current source to regulate the common-mode output current of the pair of diodes; and
an input-stage control loop configured for controlling the first current source to regulate the common-mode output current of the pair of diodes to be substantially equal to the first reference current.

18. A method for operating a variable gain amplifier comprising a first differential transistor pair coupled to a signal input, a first current source configured to provide a first bias current to the first differential transistor pair, a pair of diodes coupled to an output of the first differential transistor pair, a second differential transistor pair having an input coupled to the pair of diodes, and a second current source configured to provide a second bias current to the second differential transistor pair, the method comprising:
causing a common-mode output current of the pair of diodes to be substantially equal to a first reference current by adjusting a current of the first current source;
causing a common-mode output current of the second differential transistor pair to be substantially equal to a sum of the first reference current and a second reference current by adjusting a current of the second current source; and
adjusting a gain of the variable gain amplifier by adjusting the first reference current and the second reference current.

19. The method of claim 18, wherein the first reference current and the second reference current are adjusted such that the sum of the first reference current and the second reference current is constant over a plurality of gain settings and the common-mode output current of the second differential transistor pair is kept constant.

20. The method of claim 19, further comprising providing the first reference current and the second reference current using a digital-to-analog converter (DAC), wherein adjusting the gain of the variable gain amplifier comprises providing a digital input code to the DAC.

* * * * *